United States Patent
Vethake et al.

(10) Patent No.: US 11,025,032 B2
(45) Date of Patent: Jun. 1, 2021

(54) DOUBLE SIDED COOLING OF LASER DIODE

(71) Applicant: Trumpf Photonics, Inc., Cranbury, NJ (US)

(72) Inventors: Thilo Vethake, Cranbury, NJ (US); Stefan Heinemann, Hightstown, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 0 days.

(21) Appl. No.: 16/436,985

(22) Filed: Jun. 11, 2019

(65) Prior Publication Data

US 2020/0395729 A1   Dec. 17, 2020

(51) Int. Cl.
| | |
|---|---|
| *H01S 5/022* | (2006.01) |
| *H01S 5/023* | (2021.01) |
| *H01S 5/024* | (2006.01) |
| *H01S 5/0233* | (2021.01) |
| *H01S 5/0235* | (2021.01) |

(52) U.S. Cl.
CPC ............ *H01S 5/023* (2021.01); *H01S 5/0233* (2021.01); *H01S 5/0235* (2021.01); *H01S 5/02469* (2013.01)

(58) Field of Classification Search
CPC .. H01S 5/02236; H01S 5/02469; H01S 5/023; H01S 5/0233; H01S 5/0235; H01S 5/02345; H01S 5/0237; H01S 5/02492; H01S 5/02423
See application file for complete search history.

(56) References Cited

U.S. PATENT DOCUMENTS

| | | | |
|---|---|---|---|
| 7,864,825 B2 | 1/2011 | Thiagarajan et al. | |
| 8,130,807 B2 | 3/2012 | Schulz-Harder et al. | |
| 8,486,766 B2 * | 7/2013 | Schroeder | H01S 5/02264 438/122 |
| 2008/0192785 A1 * | 8/2008 | Schulz-Harder | H01S 5/02423 372/36 |
| 2009/0016398 A1 | 1/2009 | Lorenzen et al. | |
| 2015/0023376 A1 | 1/2015 | Yamanaka et al. | |
| 2015/0226607 A1 * | 8/2015 | Cooper | G01J 3/10 356/301 |
| 2018/0269650 A1 | 9/2018 | Nozaki | |

OTHER PUBLICATIONS

PCT International Search Report and Written Opinion in International Appln. No. PCT/US2020/036976, dated Oct. 6, 2020, 17 pages.

* cited by examiner

*Primary Examiner* — Xinning (Tom) Niu
(74) *Attorney, Agent, or Firm* — Fish & Richardson P.C.

(57) ABSTRACT

A laser diode device includes: a first heat sink including a first mounting layer, in which the first mounting layer includes at least two mounting pads electrically isolated from one another; a second heat sink including a second mounting layer, in which the second mounting layer includes at least two mounting pads electrically isolated from one another; and a laser diode bar between the first heat sink and the second heat sink, in which a bottom electrical contact of the laser diode bar is mounted to the first mounting layer, and a top electrical contact of the laser diode bar is mounted to the second mounting layer.

16 Claims, 8 Drawing Sheets

DOUBLE SIDED COOLING OF LASER DIODE

TECHNICAL FIELD

The present disclosure relates to double sided cooling of laser diodes.

BACKGROUND

High-powered semiconductor laser diodes are cooled to keep the junction temperature and carrier leakage low and reliability high. A laser diode can be mounted to a heat sink, which helps reduce thermal impedance.

SUMMARY

In general, in some aspects, the subject matter of the present disclosure may be embodied in laser diode devices, which include: a first heat sink including a first mounting layer, in which the first mounting layer includes at least two mounting pads electrically isolated from one another; a second heat sink including a second mounting layer, in which the second mounting layer includes at least two mounting pads electrically isolated from one another; and a laser diode bar between the first heat sink and the second heat sink, in which a bottom electrical contact of the laser diode bar is mounted to the first mounting layer, and a top electrical contact of the laser diode bar is mounted to the second mounting layer.

Implementations of the laser diode devices may have one or more of the following features. For example, in some implementations, the laser diode includes: a first contact bar; and a second contact bar, in which each of the first contact bar and the second contact bar is mounted between the first heat sink and the second heat sink. The first mounting layer may include a first mounting pad and a second mounting pad electrically isolated from the first mounting pad. The second mounting layer may include a third mounting pad and a fourth mounting pad electrically isolated from the third mounting pad. The bottom electrical contact of the diode laser bar may be electrically connected to the first mounting pad, and the top electrical contact of the laser diode bar may be electrically connected to the third mounting pad. A bottom surface of the first contact bar may be electrically connected to the first mounting pad of the first mounting layer, and a top surface of the first contact bar may be electrically connected to the fourth mounting pad of the second mounting layer. A bottom surface of the second contact bar may be electrically connected to the second mounting pad of the first mounting layer, and a top surface of the second contact bar may be electrically connected to the third mounting pad of the second mounting layer. The first contact bar may extend beyond a first edge of at least one of the first heat sink and the second heat sink, and the second contact bar may extend beyond a second edge of at least one of the first heat sink and the second heat sink. A shape of the first mounting pad of the first mounting layer may be the same as a shape of the third mounting pad of the second mounting layer, and a shape of the second mounting pad of the first mounting layer may be the same as a shape of the fourth mounting pad of the second mounting layer. The second mounting pad of the first mounting layer may overlap the third mounting pad of the second mounting layer without overlapping the fourth mounting pad of the second mounting layer. The first mounting pad of the first mounting layer may overlap the third mounting pad and the fourth mounting pad of the second mounting layer.

In some implementations, a height of each of the first contact bar, the second contact bar, and the laser diode between the first heat sink and the second heat sink may be the same.

In some implementations, the first heat sink includes: a first main body portion including at least one fluid channel; a first electrical insulating layer on the first main body portion; and the first mounting layer on the first electrical insulating layer. The second heat sink includes: a second main body portion including at least one fluid channel; a second electrical insulating layer on the second main body portion; and the second mounting layer on the second electrical insulating layer. Each of the first main body portion, the second main body portion, the first mounting layer, and the second mounting layer may be formed of a metal. The metal is copper or copper tungsten. Each of the first electrical insulating layer and the second electrical insulating layer may be formed of a ceramic.

In general, in some other aspects, the subject matter of the present disclosure may be embodied in laser diode bar cooling apparatuses that include: a first heat sink including a first mounting layer for mounting to a laser diode bar, in which the first mounting layer includes a first mounting pad and a second mounting pad electrically isolated from one another; a second heat sink including a second mounting layer for mounting to the laser diode bar, in which the second mounting layer includes a third mounting pad and a fourth mounting pad electrically isolated from one another; and multiple contact bars for mounting between the first heat sink and the second heat sink.

Implementations of the laser diode cooling apparatus may include one or more of the following features. For example, in some implementations, a shape of the first mounting pad is the same as a shape of the third mounting pad, and a shape of the second mounting pad is the same as a shape of the fourth mounting pad.

In some implementations, the shape of the first mounting pad is different from the shape of the second mounting pad.

In some implementations, when the first heat sink and the second heat sink are oriented such that the first mounting layer faces the second mounting layer, the second mounting pad of the first mounting layer overlaps the third mounting pad of the second mounting layer without overlapping the fourth mounting pad of the second mounting layer. In some implementations, when the first heat sink and the second heat sink are oriented such that the first mounting layer faces the second mounting layer, the first mounting pad of the first mounting layer overlaps the third mounting pad and the fourth mounting pad of the second mounting layer.

In some implementations, the first heat sink includes: a first main body portion including at least one fluid channel; a first electrical insulating layer on the first main body portion; and the first mounting layer on the first electrical insulating layer. The second heat sink includes: a second main body portion including at least one fluid channel; second electrical insulating layer on the second main body portion; and the second mounting layer on the second electrical insulating layer.

Implementations of the subject matter disclosed herein may have multiple advantages. For example, in some implementations, the optical output power of a laser diode may be increased through double sided cooling. In some implementations, segmenting the mounting pads of at least one cooler surface enables tailored electrical contacting, such as individually addressable emitters and serial connection of diode laser segments. In some implementations, the cost of the packaging process can be reduced due mounting of components along a single plane.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 2A is a schematic illustrating a top view of a first electrically insulated cooler, whereas

FIG. 3A is a schematic illustrating a top view of a second electrically insulated cooler, whereas

DETAILED DESCRIPTION

The output power of diode lasers is limited in large part by heat dissipation, which causes the temperature of the diode lasers to increase, which, in turn, can reduce the reliability and operating efficiency of the diodes. Heat sinks with high thermal conductivity, such as copper coolers, may be used to keep the diode laser temperature stable during operation. An example electrically insulated cooler to which laser diodes can be mounted is the ILASCO diode cooler, which is fabricated from a stack of thin copper sheets having high thermal conductivity. The individual stacked copper sheets define an internal integrated coolant passage through which a coolant is provided. An electrically conductive mounting pad is formed on a top and/or bottom surface of copper sheets. The laser diode then may be mounted directly to the electrically conductive mounting pad using a solder. For example, the p-side contact of the semiconductor laser diode may be mounted directly to the electrically conductive mounting pad. To prevent electro-corrosion of the heat sinks, the coolant paths within such heat sinks can be protected from the electrically conductive mounting pad by providing insulating layers between the electrically conductive mounting pad and the portion of the heat sink that forms the coolant passage.

Cooling on both sides of a laser diode, rather than a single side, can improve the stability and operating efficiency of a laser diode even further. However, making electrical contact to a laser diode cooled on two sides can be complicated since it may be difficult to access contact pads coupled to the diode. Furthermore, double-sided cooling can lead to damage of the laser diode resulting from forces applied during the mounting process.

Figure 1:
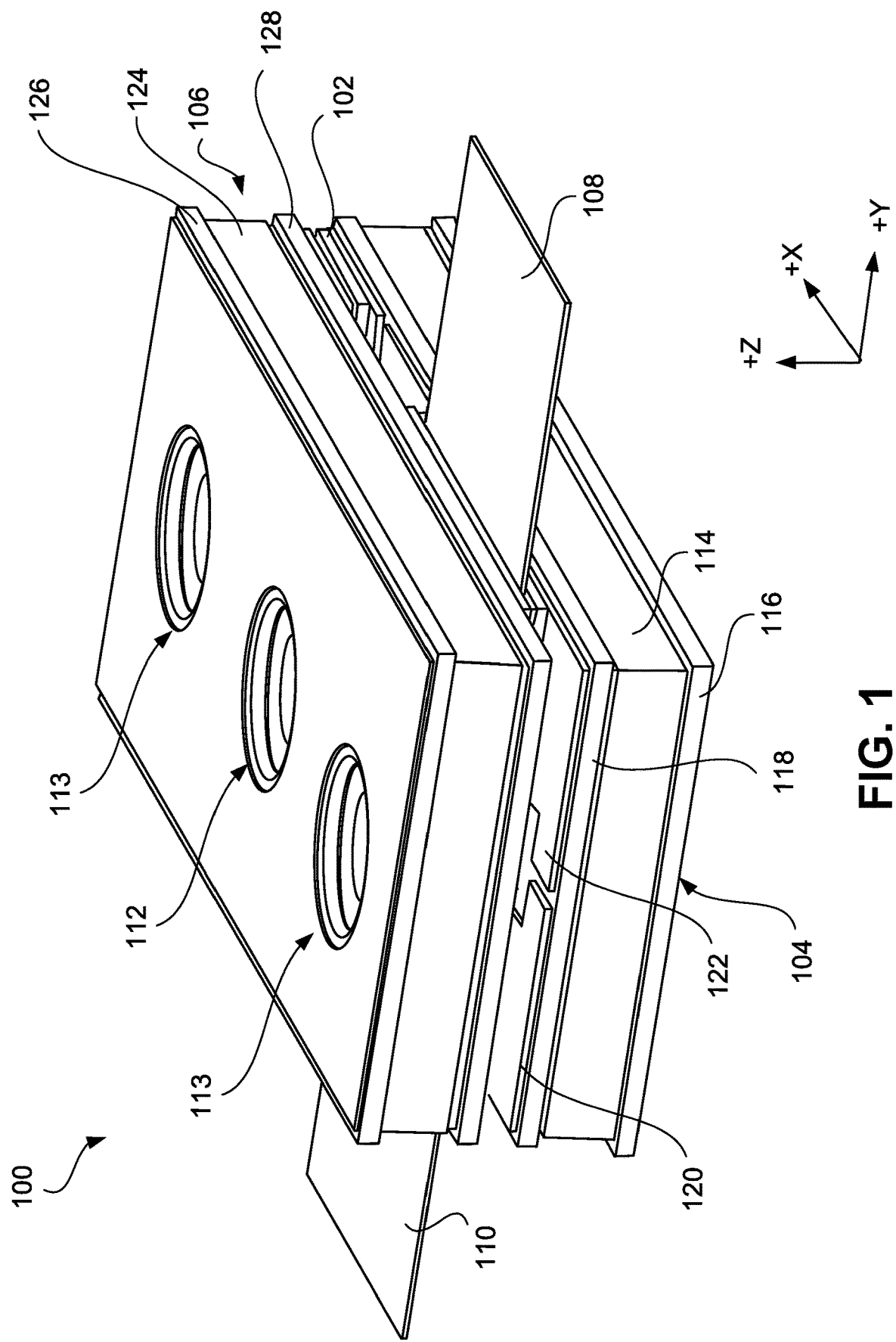
FIG. 1 is a schematic illustrating an example of double-sided cooling of a laser diode.

FIG. 1 is a schematic illustrating a perspective view of an example of double-sided cooling of a laser diode. The exemplary apparatus 100 includes a first heat sink 104, a second heat sink 106, and a laser diode device 102 mounted between the first heat sink 104 and the second heat sink 106. The apparatus 100 further includes a first contact bar 108 and a second contact bar 110, in which each of the first and second contact bars 108, 110 are mounted between the first heat sink 104 and the second heat sink 106. Further, each contact bar 108, 110 provides a contact for electrically connecting to a different electrode of the laser diode 102. For example, the apparatus 100 may be configured and arranged so that contact bar 108 provides an electrical contact to the p-type electrode of laser diode 102, whereas the apparatus 100 also is configured and arranged so that contact bar 110 provides an electrical contact to the n-type electrode of laser diode 102.

Each of the first heat sink 104 and the second heat sink 106 may include, e.g., an integrated cooler device that has one or more integrated internal coolant passages, as well as an electrically conductive mounting layer separated from the integrated coolant passages by an insulating layer. For example, the first heat sink 104 is formed from a main body portion 114 and an electrically insulating layer 118 on the main body portion 114. In some implementations, the first heat sink 104 also includes a second electrically insulating layer 116 on a back side of the main body portion 114 that is opposite the side on which insulating layer 118 is formed. The main body portion 114 may include, for example, an internal coolant passage through which a coolant may flow to absorb heat generated by the laser diode 102 and transfer the heat away to maintain the laser diode at a constant temperature.

Similarly, the second heat sink 106 is formed from a main body portion 124 and an electrically insulating layer 128 on the main body portion 124. The main body portion 124 of the second heat sink 106 may also include its own internal coolant passage through which a coolant may flow to absorb heat generated by the laser diode 102 and transfer the heat away to maintain the diode 102 at a constant temperature. In some implementations, the second heat sink 126 may include a second electrically insulating layer 126 on a back side of the main body portion 124 that is opposite the side on which insulating layer 118 is formed.

To provide for high heat transfer from the laser diode 102, the main body portions 114, 124 and layers 118, 128 are formed from materials with high thermal conductivity. To reduce electro-corrosion with the main body portions 114, 124, however, the material of the insulating layers 118, 128 also may have high electrically insulating properties. For example, the main body portions 114, 124 may be formed from a metal, such as copper, which has a thermal conductivity of about 385.0 W/m*K at around room temperature, or copper tungsten. In contrast, the electrically insulating layers 118, 128 may be formed from aluminum nitride, which has a thermal conductivity of about 140 W/m*K and an electrical resistivity of greater than about $10^{14}$ ohm*cm at around room temperature, or from diamond, which has a thermal conductivity of greater than about 1800 W/m*K and an electrical resistivity of greater than about $10^{16}$ Ω*cm at around room temperature. In some cases, the main body portions 114, 124 may be formed from a stack of plates, such as copper or copper tungsten plates, each of which is etched to define a different part of the coolant passages.

In some cases, each heat sink 104, 16 also includes an opening into which the coolant may be provided into the coolant passages, and thus serves as a coupling region. For example, as shown in FIG. 1, heat sink 106 includes openings 113 that extend through the electrically insulating layer 126 and into the main body portion 102. The openings 113 connect to the at least one coolant passage formed within the main body portion 124. Similarly, heat sink 104 also may include one or more openings that couple to internal coolant passages within main body portion 114 and thus serve as a coupling region.

Each of heat sink 104 and 106 also includes a corresponding mounting layer onto which the laser diode 102 and the contact bars are mounted. For example, as shown in FIG. 1, heat sink 104 includes a first mounting layer that is formed from mounting pads 120, 122. The mounting pads 120, 122 are formed on the electrically insulating layer 118 from a material with high electrical conductivity (e.g., a metal such as copper or copper tungsten) to provide electrical contact to the semiconductor laser diode 102 and/or to the contact bars 108, 110. Heat sink 106 also may include a mounting layer formed from multiple mounting pads similar to heat sink 104.

Figure 2A:
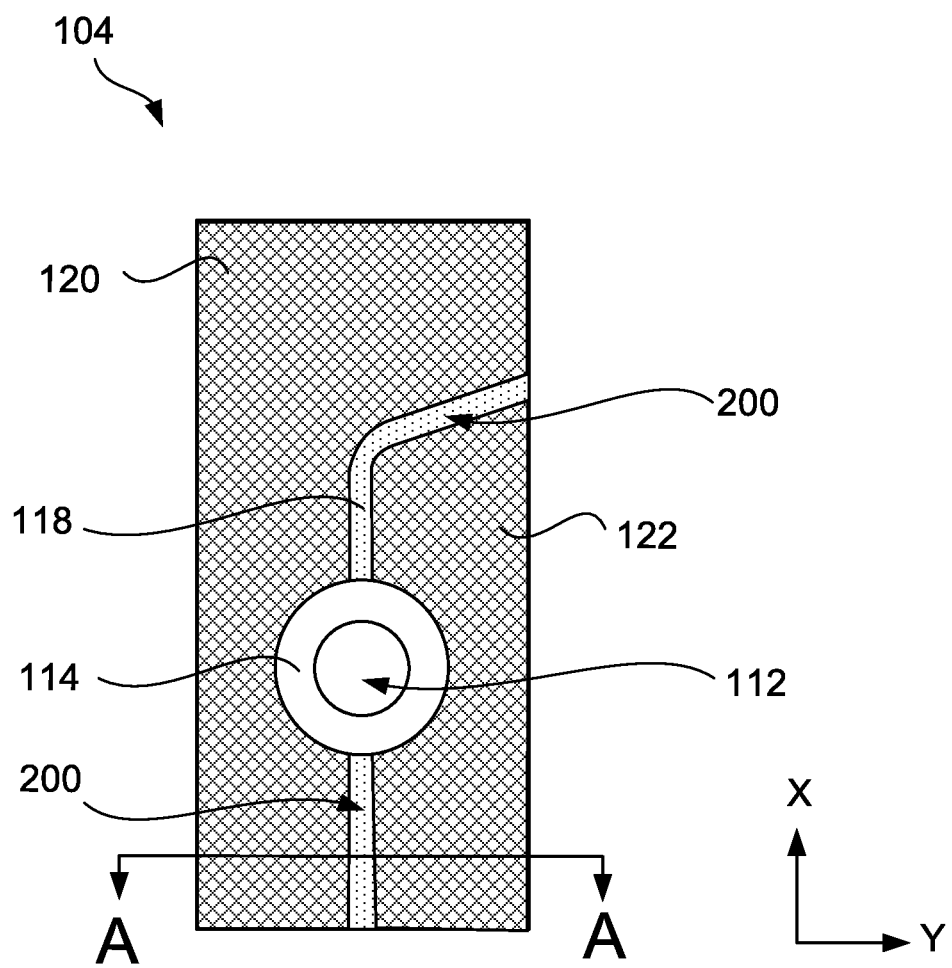
Figure 2B:
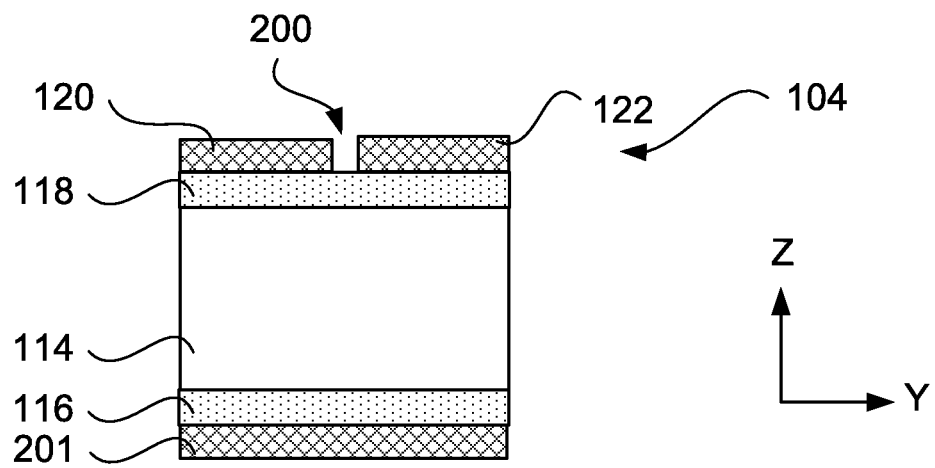
FIG. 2B is a side view of the electrically insulated cooler through section A-A of FIG. 2A.
Figure 3A:
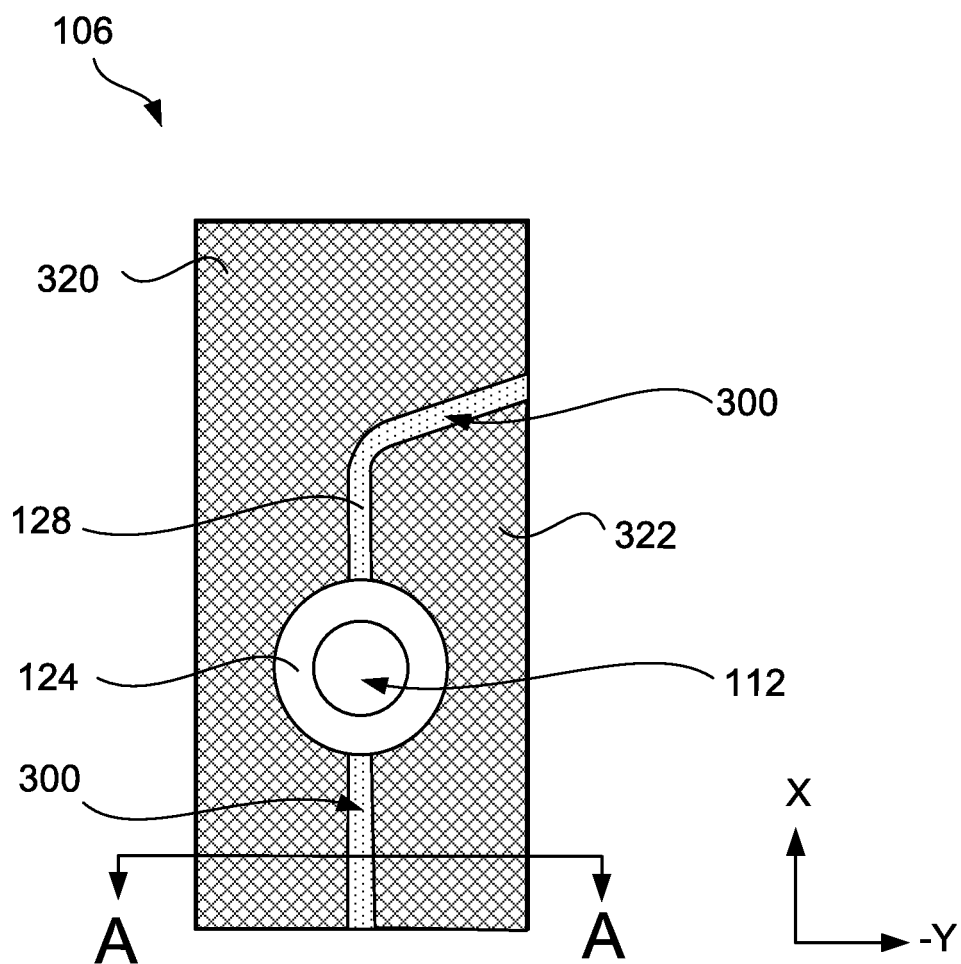

FIG. 2A is a schematic that illustrates a top view of the heat sink 104 with the laser diode 102, contact bars 108, 110, and heat sink 106 removed. FIG. 3A is a schematic that illustrates a bottom view of the heat sink 106 with the laser diode 102, contact bars 108, 110, and heat sink 104 removed. That is, FIG. 3A provides a view of the surface of heat sink 106 that faces the laser diode 102 and contact bars 108, 110. FIG. 2B is a schematic that illustrates a side view of the first heat sink 104 through the cross-section A-A shown in FIG. 2A. FIG. 2B is a schematic that illustrates a side view of the second heat sink 106 through the cross-section A-A shown in FIG. 3A. In some implementations, as shown in FIGS. 2A-3B, each of heat sink 104 and heat sink 106 have an identical configuration and arrangement of the main body portion, electrical insulating layers and mounting layers.

Figure 3B:
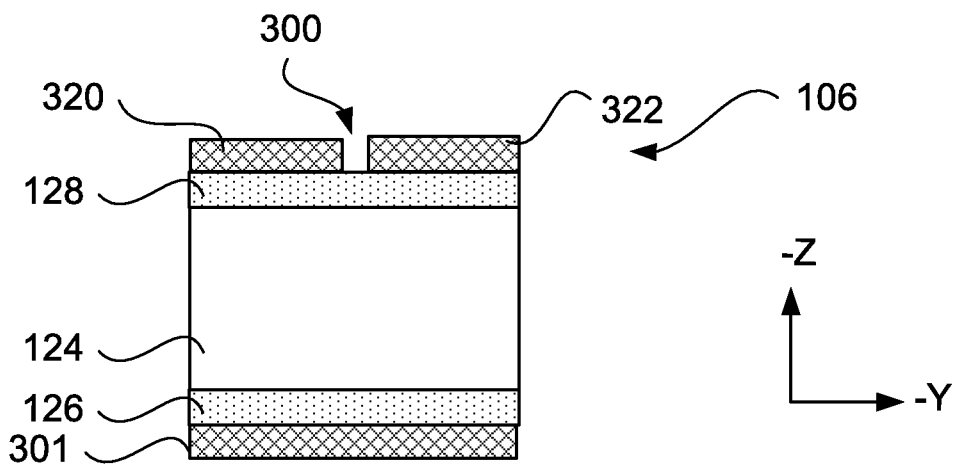
FIG. 3B is a side view of the electrically insulated cooler through section A-A of FIG. 3A.

As explained herein and shown in FIG. 2B, first heat sink 104 includes the main body portion 114, the first electrically insulating layer 118, the second electrically insulating layer 116, and a mounting layer including multiple mounting pads 120, 122. In some cases, first heat sink 104 also includes a metal layer 201 on an opposite side of the heat sink on which the mounting layer is formed. Similarly, as shown in FIG. 3B, second heat sink 106 includes the main body portion 124, the first electrically insulating layer 128, the second electrically insulating layer 126, and a mounting layer including multiple mounting pads 320, 322. In some cases, second heat sink 104 also includes a metal layer 301 on an opposite side of the heat sink on which the mounting layer is formed.

With reference to FIGS. 2A-2B, each of the mounting pads 120, 122 within the mounting layer of the first heat sink 104 may be electrically isolated from one another. To electrically isolate the mounting pads from one another, the mounting pads may be separated by a physical gap. For example, the first mounting pad 120 is physically and electrically separated from second mounting pad 122 by a gap 200. Because the mounting pads 120, 122 are also formed on electrically insulating layer 118, there is also little to no electrical conduction between the pads through layer 118. Similarly, with reference to FIGS. 3A-3B, each of the mounting pads 320, 322 within the mounting layer of the second heat sink 106 may be electrically isolated from one another. For example, the first mounting pad 320 is physically and electrically separated from second mounting pad 322 by a gap 300. Because the mounting pads 320, 322 are also formed on electrically insulating layer 128, there is also little to no electrical conduction between the pads through layer 128.

The multiple contact pads (e.g., pads 120, 122 or pads 320, 322) of each heat sink may be formed by first providing a layer of electrically conductive material (e.g., copper or copper tungsten) onto a surface of the electrically insulating layer of the heat sinks. For example, a layer of copper may be deposited directly onto the surface of electrically insulating layer 118, whereas a layer of copper may be deposited directly onto a surface of electrically insulating layer 128. Standard deposition techniques such as physical vapor deposition, e-beam deposition, or electroplating, among others may be used to form the electrically conductive material. The electrically conductive material may be formed to have a thickness in the range of, e.g., between about 50 nm and about several tens of microns.

The contact pads (e.g., pads 120, 122 or pads 320, 322) of each heat sink then may be defined by forming the gap in the as-provided electrically conductive material. For instance, the gaps 200, 300 may be formed by performing ion-milling or chemical etching of the electrically conductive material in just the region where gap 200 is to be defined. This process may include, e.g., depositing a resist as a mask, and then defining the gap region in the resist mask using lithography before performing the mill or etch. Other suitable techniques for defining the gaps may be used instead. For example, in some cases, the gaps 200, 300 may be formed by stamping the electrically conductive material. As a result of the etching process, multiple electrically isolated mounting pads, each having the same thickness may be formed directly in contact with the surface of the underlying electrically insulating layer (e.g., layer 118 or layer 128). In some implementations, forming the gaps 200, 300 may expose the underlying electrical insulating layers. A width of the gaps 200, 300 between facing edges of the first mounting pad (e.g., pad 120 or pad 320) and the second mounting pad (e.g., pad 122 or pad 322) may be less than about 1.5 mm. For example, the width of the gaps 200, 300 may be about 1.25 mm or less, 1 mm or less, 0.75 mm or less, or 0.5 mm or less.

In some implementations, each gap between the mounting pads is empty (e.g., only air exists in the gap between each mounting pad). In other implementations, the gaps may be filled with an electrically insulating material. For instance, the gaps 200, 300 may be filled with a dielectric, polymer, epoxy or glue.

In some implementations, the main body portions (e.g., 114, 124) include openings to which a fluid coupler may be attached. For example, as shown in FIG. 1, main body portion 124 includes openings 113 that extend from an exterior to an interior region of the heat sink. One of the two opening 113 is used to supply a cooling fluid (e.g., water) to the interior of the main body portion 124, whereas the other of the two openings 113 is for withdrawing the cooling fluid from the heat sink. The main body portion 124 may include internal fluidic channels fluidly coupled to the openings 113 and through which the cooling fluid may propagate to allow cooling of the heat sink during operation of the device. Though not shown in FIG. 1, main body portion 114 may also include inlet and outlet openings 113 for receiving and withdrawing cooling fluid in a similar manner as main body portion 124. Each of the main body portions may also include one or more mounting holes for fixing the heat sinks in place. For example, FIG. 1 shows that main body portion 124 includes a mounting hole 112 situated between the fluid inlet and outlets 113. Examples of mounting holes 112 are also shown in FIGS. 2A and 3A, in which the opening 112 extends into the main body portion of the heat sink. To provide access to the openings 112 and 113, at least some of the electrical insulating layers (e.g., layers 118, 128) and some of the mounting layer (e.g., portions of pads 120, 122 and/or portions of pads 320, 322) are removed.

Figure 4:
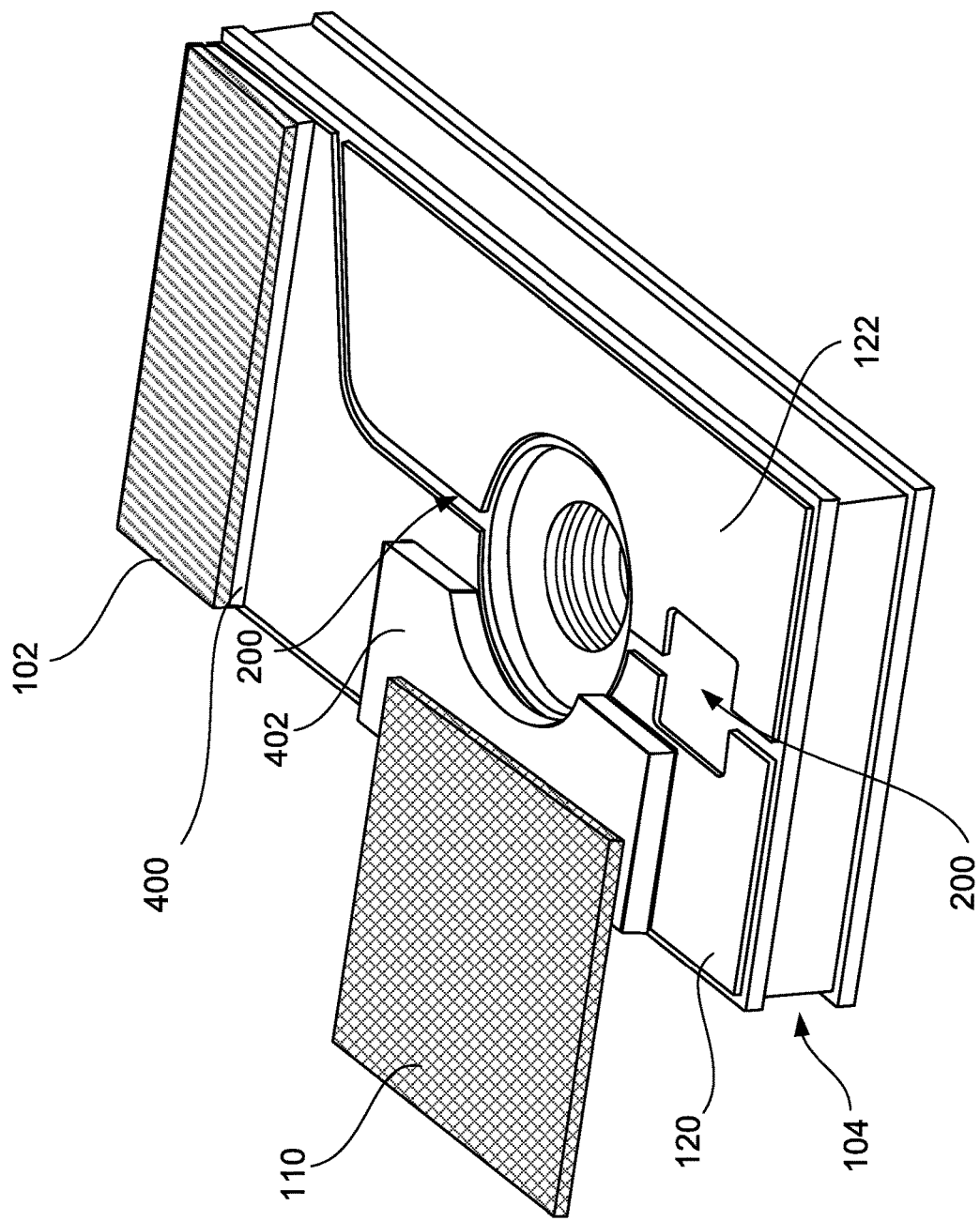
FIGS. 4 and 5 are schematics illustrating perspective views of a contact bar and laser diode mounted to a first electrically insulated cooler.

FIG. 4 is a schematic that shows a perspective view of the exemplary first heat sink 104 with the second heat sink 106 and first contact bar 108 omitted for ease of viewing. As shown in FIG. 4, laser diode 102 is mounted to the first mounting pad 120. For example, laser diode 102 may include a first electrode (e.g., a p-type contact) on a first or bottom surface that is electrically connected to the first mounting pad 120. The laser diode 102 may be physically and electrically connected to the first mounting pad 120 using a solder connection, e.g., a first solder layer 400 between the mounting pad 120 and the laser diode 120. For example, the laser diode 102 may be soldered to first mounting pad 120 using a AuSn solder layer. During fabrication, the solder layer 400 on which the laser diode 102 is placed may be provided by a solder preform. For instance, the solder may come in a predefined shape (e.g., rectangular prism) of solid material. The footprint of the solder preform 400 may be the same as the footprint of the laser diode 102. The preform may have a thickness in a range of about 10 microns to 40 microns, including, e.g., between about 15 microns to about 35 microns, between about 20 microns to about 30 microns, or about 25 microns, among others. The preform 400 is placed between the bottom surface of the laser diode 102 and the mounting pad 120. When the second heat sink 106 is mounted to the top surface of the laser diode 102, the solder preform 400 may be heated, allowing the solder to reflow and join the diode 102 to the mounting pad 120.

Separately, the second contact bar 110 also is mounted to the mounting pad 120. The second contact bar 110 provides an electrical contact region to which the first electrode (e.g., the p-type contact) of the bottom surface of the laser diode 102 may be electrically connected. That is, an electrically conductive pathway may be established from the bottom electrode of the laser diode 102 to the contact bar 110 through the mounting pad 120. The contact bar 110 extends outwardly over the edge of the heat sink 104 so that when both heat sinks 104, 106 are applied, it is possible to easily access the surface of the contact bar 110 and make an electrical connection. The external electrical connection to the edge of the contact bar 110 that protrudes from the edge of the heat sink may be made by, e.g., wire bonding, clamping, ribbon bonding, or soldering, among other types of electrical connections.

The contact bar may have a length in the range of about 5 mm to about 30 mm, a width in the range of about 0.5 mm to about 20 mm, and a height or depth in the range of about 0.1 mm to about 5 mm. An exemplary dimension of the contact bar is 17.5 mm in length, 4.5 mm in width, and 1.75 mm in depth. The contact bar 110 may include a material with high electrical conductivity, such as copper or copper tungsten. The contact bar 110 may be physically and electrically connected to the mounting pad 120 using a solder connection, e.g., a solder layer between the mounting pad 120 and the contact bar 110. For example, the contact bar 110 may be soldered to the mounting pad 120 using a AuSn solder layer. During fabrication, the solder layer on which the contact bar 110 is placed may be provided by a solder preform 402. For instance, the solder may come in a predefined shape (e.g., rectangular prism) of solid material. The preform 402 is placed between the bottom surface of the contact bar 110 and the mounting pad 120. When the second heat sink 106 is mounted to the top surface of the contact bar 110, the solder preform 402 may be heated, allowing the solder to reflow and join the contact bar 110 to the mounting pad 120.

Both the contact bar 110 and the laser diode are also bonded to the second heat sink 106. To provide the bond joint for the contact bar 110, a second solder connection, e.g., a solder layer 502, is provided between the contact bar 110 and the mounting pad 322 (see FIG. 5) of the second heat sink 106. For example, the contact bar 110 may be soldered to the mounting pad 322 using a AuSn solder layer. During fabrication, the additional solder layer 502 may be provided on top of the contact bar 110 in the form of a solder preform (see FIG. 5). The preform 502 is placed between the upper surface of the contact bar 110 and the mounting pad 322 of the second heat sink 106. When the second heat sink 106 is mounted to the top surface of the contact bar 110, the solder preform 502 may be heated, allowing the solder to reflow and join the contact bar 110 to the mounting pad 322. The preform 502 may have a footprint that matches at least a portion of the footprint of the contact bar 110.

Figure 5:
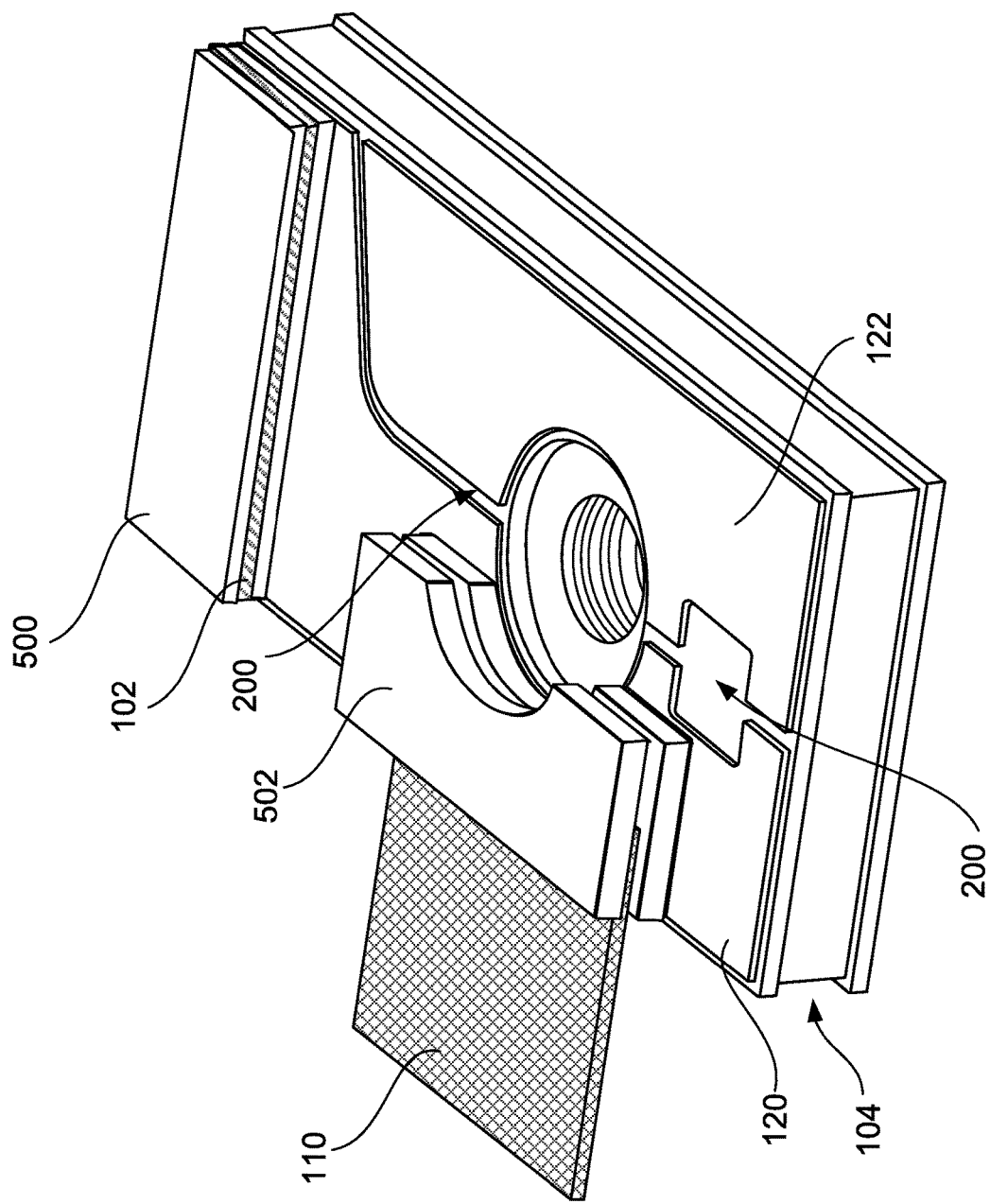

Similarly, a solder layer 500 may be used to bond a second, or top, surface of the laser diode 102 to the other mounting pad 320 of the upper heat sink 106 (see FIG. 5). For example, laser diode 102 may include on the second surface a second electrode (e.g., a n-type contact) that is electrically connected to the mounting pad 320. The second surface may be the surface of diode 102 that is opposite from the first or bottom surface of diode 102. The laser diode 102 may be physically and electrically connected to the mounting pad 320 using a solder connection, e.g., a solder layer between the mounting pad 320 and the laser diode 102. For example, the laser diode 102 may be soldered to mounting pad 320 using a AuSn solder layer. During fabrication, the solder layer 500 on the top surface of the laser diode 102 may be provided by a solder preform (see FIG. 5). For instance, the solder may come in a predefined shape (e.g., rectangular prism) of solid material. The preform 500 may have the same footprint as a footprint of the laser diode 102. The preform 500 is placed between the top surface of the laser diode 102 and the mounting pad 320. When the second heat sink 106 is mounted, the solder preform 500 may be heated, allowing the solder to reflow and join the diode 102 to the mounting pad 320.

Figure 6:
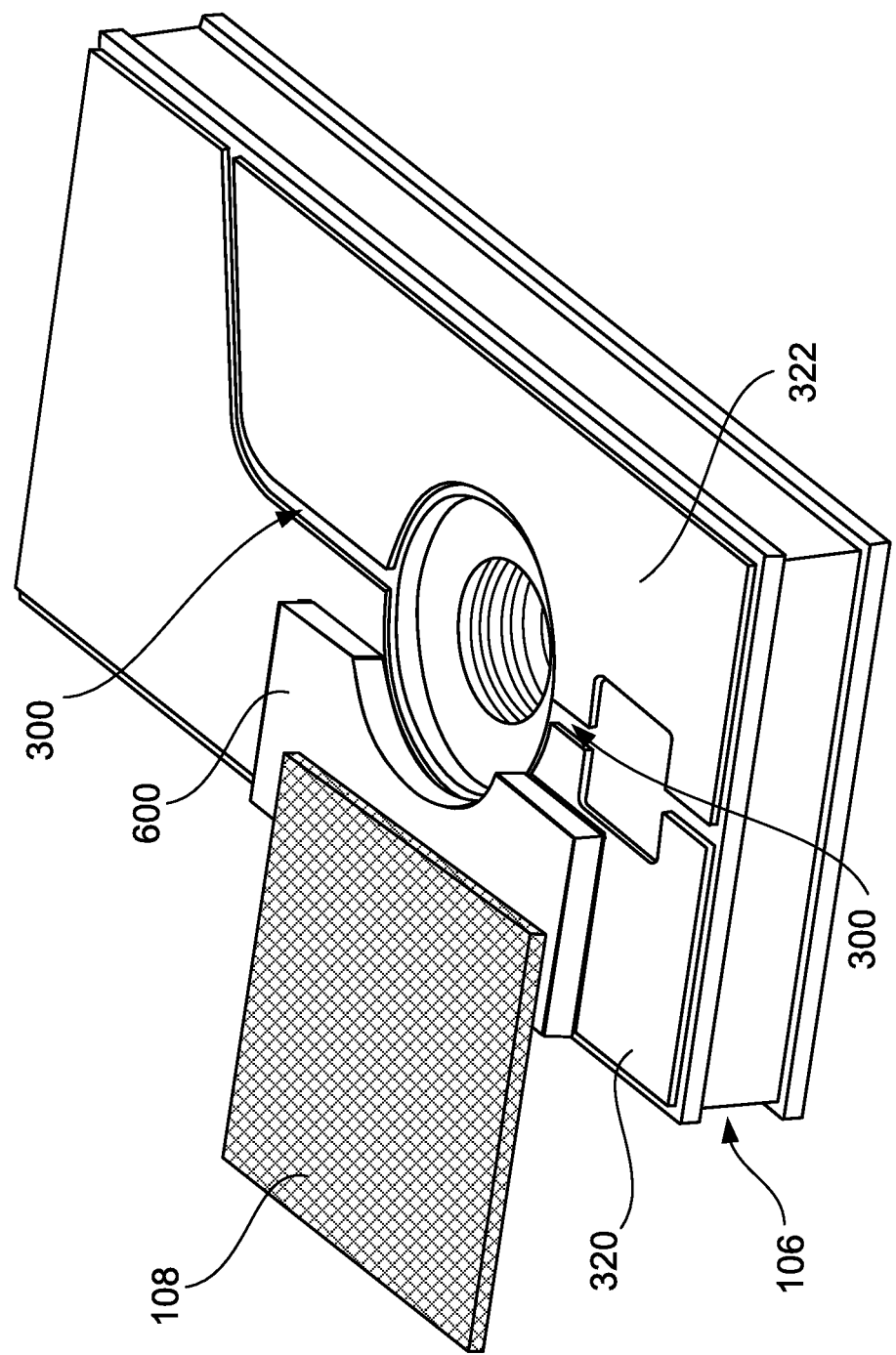
FIGS. 6 and 7 are schematics illustrating perspective views of a contact bar and laser diode mounted to a second electrically insulated cooler.

FIG. 6 is a schematic that shows a perspective view of the exemplary second heat sink 106 with the first heat sink 104, second contact bar 110, and laser diode 102 omitted for ease of viewing. As shown in FIG. 6, first contact bar 108 is mounted to the mounting pad 320. The first contact bar 108 provides an electrical contact region to which the second electrode (e.g., the n-type contact) of the top surface of the laser diode 102 may be electrically connected. That is, an electrically conductive pathway may be established from the top electrode of the laser diode 102 to the first contact bar 108 through the mounting pad 320. The contact bar 108 extends outwardly over and beyond the edge of the heat sink 106 so that when both heat sinks 104, 106 are applied, it is possible to easily access the surface of the contact bar 108 and make an electrical connection. The contact bar 108 may include a material with high electrical conductivity, such as copper or copper tungsten. The contact bar 108 may be physically and electrically connected to the mounting pad 320 using a solder connection, e.g., a solder layer between the mounting pad 320 and the contact bar 108. For example, the contact bar 108 may be soldered to the mounting pad 320 using a AuSn solder layer. During fabrication, the solder layer on which the contact bar 108 is placed may be provided by a solder preform 600. For instance, the solder may come in a predefined shape (e.g., rectangular prism) of solid material. The preform 600 is placed between the contact bar 108 and the mounting pad 320. When the first heat sink 104 is mounted to the contact bar 108, the solder preform 600 may be heated, allowing the solder to reflow and join the contact bar 108 to the mounting pad 320.

Figure 7:
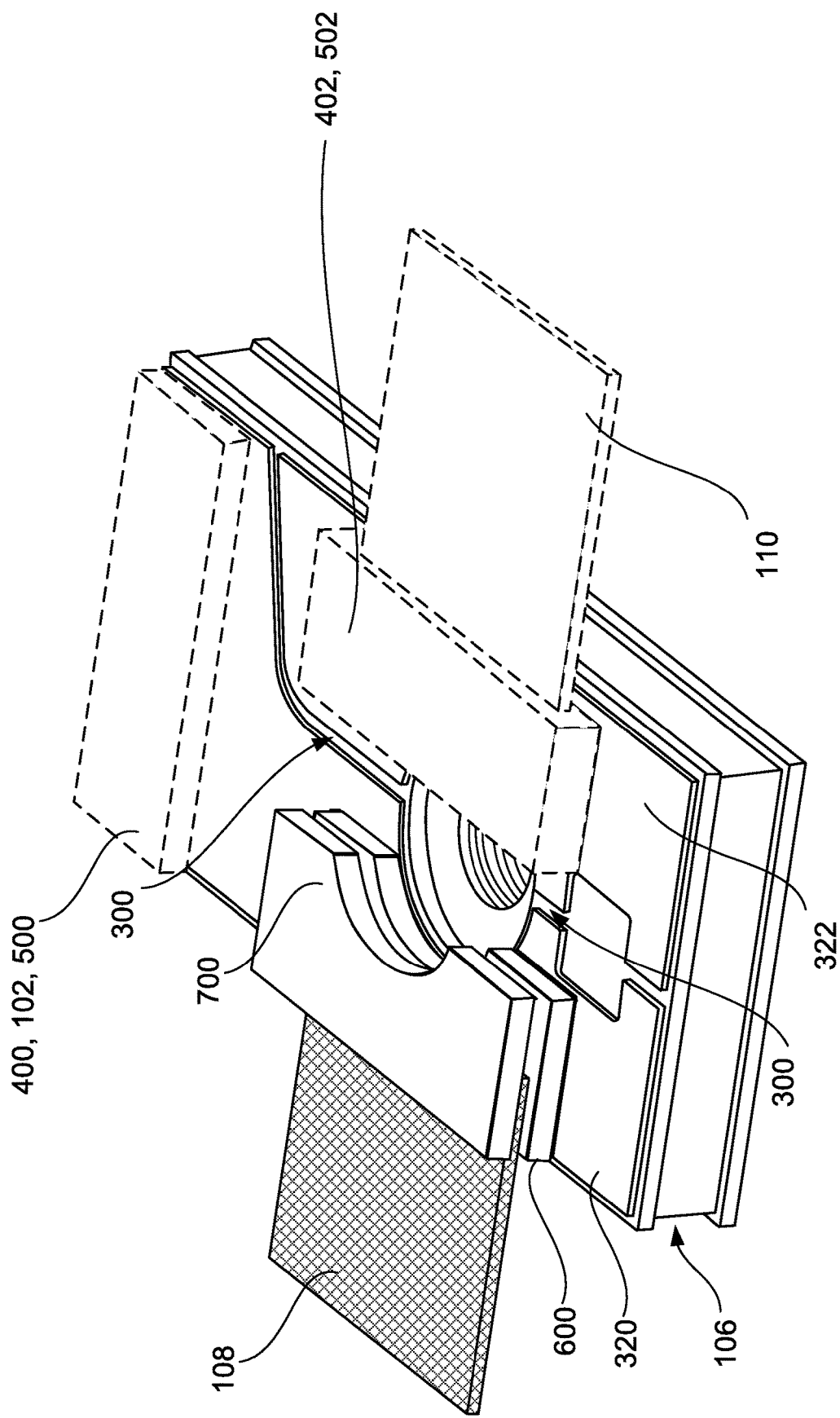

FIG. 7 is a schematic that shows a perspective view of the exemplary second heat sink 106 with the first heat sink 104 omitted for ease of viewing. Dashed outlines of the laser diode 102, the second contact bar 110 and solder preforms 402, 502 are included to illustrate the position of those features relative to the contact pads 320, 322 of the second heat sink 106 in the completed device.

As shown in FIG. 7, to provide the bond joint for the contact bar 108 to the mounting pad 122 of the first heat sink 104, an additional solder connection, e.g., a solder layer 700, is provided on the contact bar 108. For example, the contact bar 108 may be soldered to the mounting pad 122 using a AuSn solder layer. During fabrication, the additional solder layer 700 may be provided on the contact bar 108 in the form of a solder preform. The preform 700 is placed between the contact bar 108 and the mounting pad 122 of the first heat sink 104. When the first heat sink 104 and second heat sink 106 are mounted, the solder preform 700 may be heated, allowing the solder to reflow and join the contact bar 108 to the mounting pad 122. As explained herein, a solder preform 500 may be used to bond a first surface of the laser diode 102 to the other mounting pad 320 of the upper heat sink 106 (see FIGS. 6-7), and another solder preform 400 may be used to bond a second surface of the laser diode 102 to mounting pad 120 of the lower heat sink 104 (see FIGS. 4-5).

Figure 8:
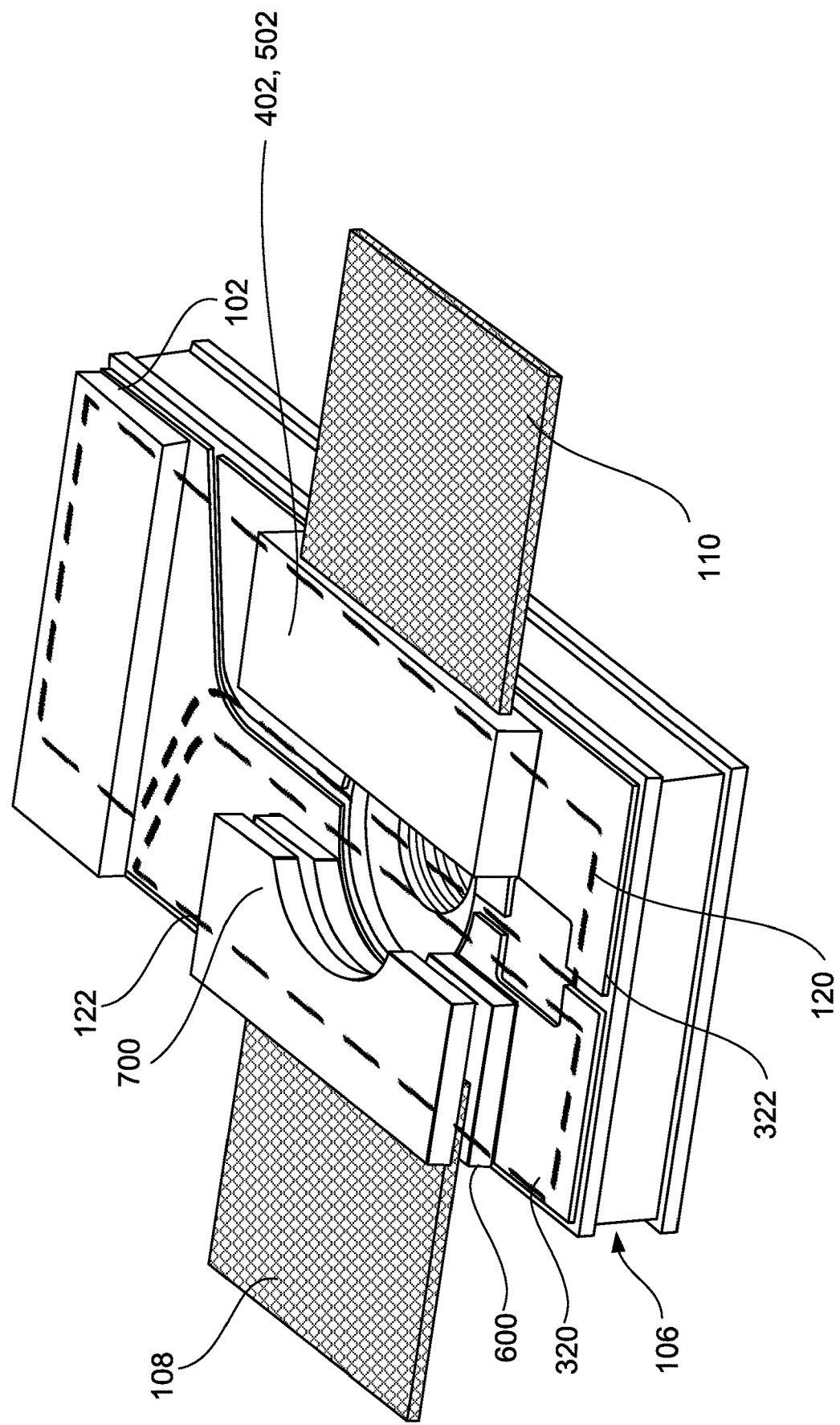
FIG. 8 is a schematic that illustrates an exemplary electrically insulated cooler together with contact bars and a laser diode.

As illustrated in FIG. 7, the gap 300 between the mounting pad 320 and the mounting pad 322 provides electrical isolation of the contact bar 110 from the electrode of the laser diode 102 that is in contact with the mounting pad 320. When the lower heat sink 104 is bonded in place, the contact bar 110 provides a direct electrical connection to the electrode of the laser diode 102 that is in contact with the mounting pad 120. For instance, FIG. 8 is a schematic that illustrates upper heat sink 106 together with both contact bars 108, 110 and laser diode 102. Also shown in FIG. 8 is an outline of mounting pad 120 and mounting pad 122 of the heat sink 104 depicting their position relative to the contact bars and laser diode 102 when both heat sinks are mounted (e.g., as in FIG. 1). The contact bar 110 is directly electrically connected to the electrode on the bottom surface of the laser diode 102 through mounting pad 120 (and the solder layers 400, 402). The electrode on the bottom surface of laser diode 102 does not, however, electrically short with the electrode on laser diode's upper surface given the gap 200 that exists between mounting pads 120 and 122, as well as the gap 300 between mounting pads 320 and 322. Similarly, the contact bar 108 is directly electrically connected to the electrode on the upper surface of laser diode 102 through mounting pad 320 (and the solder layers 500, 600). The electrode on the upper surface of laser diode 102 does not, however, electrically short with the electrode on the laser diode's bottom surface given the gap 300 that exists between mounting pads 320 and 322, as well as the gap 200 between mounting pads 120 and 122. The thickness of each of the contact bars 108, 110, solder preforms (400, 402, 500, 502, 600, 700), and the laser diode 102 may be set such that when both heat sinks are mounted, the distance between the lower heat sink and upper sink is uniform. That is, the total thickness (as measured from the surface of pad 120 to the surface of pad 322) of preform 402 (after reflow), contact bar 110, and preform 502 (after reflow) is the same as the total thickness (as measured from the surface of pad 122 to the surface of pad 320) of preform 700 (after reflow), contact bar 108, and preform 600 (after reflow), which in turn is the same as the total thickness (as measured from the surface of pad 120 to the surface of pad 320) of preform 400, laser diode 102 and preform 500.

A number of embodiments of the invention have been described. Nevertheless, it will be understood that various modifications may be made without departing from the spirit and scope of the invention. Accordingly, other embodiments are within the scope of the following claims.

What is claimed is:

1. A laser diode device comprising:
    a first heat sink comprising a first mounting layer, wherein the first mounting layer comprises a first mounting pad and a second mounting pad that is separate from the first mounting pad;
    a second heat sink comprising a second mounting layer, wherein the second mounting layer comprises a third mounting pad and a fourth mounting pad that is separate from the third mounting pad;
    a laser diode bar between the first heat sink and the second heat sink, wherein a bottom electrical contact of the laser diode bar is both mounted to and electrically connected to the first mounting pad of the first mounting layer, and a top electrical contact of the laser diode bar is both mounted to and electrically connected to the third mounting pad of the second mounting layer;
    a first contact bar; and
    a second contact bar,
    wherein each of the first contact bar and the second contact bar is mounted between the first heat sink and the second heat sink,
    a bottom surface of the first contact bar is electrically connected to the first mounting pad of the first mounting layer, and
    a top surface of the first contact bar is electrically connected to the fourth mounting pad of the second mounting layer.

2. The laser diode device of claim 1,
    wherein a bottom surface of the second contact bar is electrically connected to the second mounting pad of the first mounting layer, and
    a top surface of the second contact bar is electrically connected to the third mounting pad of the second mounting layer.

3. The laser diode device of claim 2,
    wherein the first contact bar extends beyond a first edge of at least one of the first heat sink and the second heat sink, and
    the second contact bar extends beyond a second edge of at least one of the first heat sink and the second heat sink.

4. The laser diode device of claim 2,
    wherein a shape of the first mounting pad of the first mounting layer is the same as a shape of the third mounting pad of the second mounting layer, and
    wherein a shape of the second mounting pad of the first mounting layer is the same as a shape of the fourth mounting pad of the second mounting layer.

5. The laser diode device of claim 2,
    wherein the second mounting pad of the first mounting layer overlaps the third mounting pad of the second mounting layer without overlapping the fourth mounting pad of the second mounting layer.

6. The laser diode device of claim 2,
wherein the first mounting pad of the first mounting layer overlaps the third mounting pad and the fourth mounting pad of the second mounting layer.

7. The laser diode device of claim 1, wherein a height of each of the first contact bar, the second contact bar, and the laser diode bar between the first heat sink and the second heat sink is the same.

8. The laser diode device of claim 1,
wherein the first heat sink comprises:
  a first main body portion comprising at least one fluid channel;
  a first electrical insulating layer on the first main body portion; and
  the first mounting layer on the first electrical insulating layer; and
wherein the second heat sink comprises:
  a second main body portion comprising at least one fluid channel;
  a second electrical insulating layer on the second main body portion; and
  the second mounting layer on the second electrical insulating layer.

9. The laser diode device of claim 8, wherein each of the first main body portion, the second main body portion, the first mounting layer, and the second mounting layer is formed of a metal.

10. The laser diode device of claim 9, wherein the metal is copper or copper tungsten.

11. The laser diode device of claim 9, wherein each of the first electrical insulating layer and the second electrical insulating layer is formed of a ceramic.

12. A laser diode bar cooling apparatus comprising:
a first heat sink comprising a first mounting layer for mounting to a laser diode bar, wherein the first mounting layer comprises a first mounting pad and a second mounting pad electrically isolated from one another;
a second heat sink comprising a second mounting layer for mounting to the laser diode bar, wherein the second mounting layer comprises a third mounting pad and a fourth mounting pad electrically isolated from one another; and
a plurality of contact bars for mounting between the first heat sink and the second heat sink,
wherein, when the first heat sink and the second heat sink are oriented such that the first mounting layer faces the second mounting layer, the second mounting pad of the first mounting layer overlaps the third mounting pad of the second mounting layer without overlapping the fourth mounting pad of the second mounting layer.

13. The laser diode bar cooling apparatus of claim 12,
wherein a shape of the first mounting pad is the same as a shape of the third mounting pad, and
wherein a shape of the second mounting pad is the same as a shape of the fourth mounting pad.

14. The laser diode bar cooling apparatus of claim 13, wherein the shape of the first mounting pad is different from the shape of the second mounting pad.

15. The laser diode bar cooling apparatus of claim 12,
wherein, when the first heat sink and the second heat sink are oriented such that the first mounting layer faces the second mounting layer, the first mounting pad of the first mounting layer overlaps the third mounting pad and the fourth mounting pad of the second mounting layer.

16. The laser diode bar cooling apparatus of claim 12,
wherein the first heat sink comprises:
  a first main body portion comprising at least one fluid channel;
  a first electrical insulating layer on the first main body portion; and
  the first mounting layer on the first electrical insulating layer; and
wherein the second heat sink comprises:
  a second main body portion comprising at least one fluid channel;
  a second electrical insulating layer on the second main body portion; and
  the second mounting layer on the second electrical insulating layer.

* * * * *